United States Patent
Schoellkopf et al.

(10) Patent No.: US 7,029,927 B2
(45) Date of Patent: Apr. 18, 2006

(54) METHOD OF REPAIRING AN INTEGRATED ELECTRONIC CIRCUIT USING A FORMED ELECTRICAL ISOLATION

(75) Inventors: Jean-Pierre Schoellkopf, Grenoble (FR); Hervé Jaouen, Meylan (FR)

(73) Assignee: STMicroelectronics S.A., (FR)

( * ) Notice: Subject to any disclaimer, the term of this patent is extended or adjusted under 35 U.S.C. 154(b) by 0 days.

(21) Appl. No.: 10/778,323

(22) Filed: Feb. 13, 2004

(65) Prior Publication Data
US 2004/0217305 A1    Nov. 4, 2004

(30) Foreign Application Priority Data
Feb. 18, 2003    (FR)    ................... 03 01937

(51) Int. Cl.
*H01L 21/00*    (2006.01)
(52) U.S. Cl. .............................. 438/4; 438/13
(58) Field of Classification Search .................. 438/4, 438/12, 13, 671
See application file for complete search history.

(56) References Cited

U.S. PATENT DOCUMENTS

| | | | |
|---|---|---|---|
| 4,466,992 A | | 8/1984 | Dreiling |
| 4,900,695 A | * | 2/1990 | Takahashi et al. .......... 438/625 |
| 5,089,426 A | | 2/1992 | Yamazaki |
| 5,230,970 A | * | 7/1993 | Atwood et al. ................ 430/5 |
| 2001/0012689 A1 | | 8/2001 | Okoroanyanwu |
| 2001/0035920 A1 | * | 11/2001 | Choi .......................... 349/54 |
| 2002/0155722 A1 | | 10/2002 | Satta |

OTHER PUBLICATIONS

Lee, et al, "Monte Carlo simulation of energy dissipation in electron beam lithography including secondary electron generation", Journal of Applied Physics. vol. 67, No. 12, Jun. 15, 1990; pp. 7560-7567.
French Search Report, FR 0301937, dated Nov. 7, 2003.

* cited by examiner

*Primary Examiner*—Chandra Chaudhari
(74) *Attorney, Agent, or Firm*—Jenkens & Gilchrist, PC

(57) ABSTRACT

A method of repairing a defect in an integrated electronic circuit caused by an incorrect lithographic mask includes the formation of an electrical isolation between two conducting parts of the circuit. The electrical isolation is obtained by at least partly filling, with an electrically insulating material, a volume hollowed out beforehand which would otherwise, and incorrectly, form an electrical connection between the two conducting parts. To do this, a mask having an aperture revealing the hollowed out volume is formed on the circuit, and the mask used to direct the filling of the electrically insulating material and correction of the lithography defined defect.

13 Claims, 2 Drawing Sheets

METHOD OF REPAIRING AN INTEGRATED ELECTRONIC CIRCUIT USING A FORMED ELECTRICAL ISOLATION

PRIORITY CLAIM

The present application claims priority from French Application for Patent No. 03 01937 filed Feb. 18, 2003, the disclosure of which is hereby incorporated by reference.

BACKGROUND OF THE INVENTION

1. Technical Field of the Invention

The present invention relates to a method of repairing an integrated electronic circuit.

2. Description of Related Art

The production of an electronic circuit with a high level of integration requires the use of expensive lithography masks. These masks define in particular the electrical connections between defined conducting parts of the circuit. Frequently an error in the design or the production of the lithography masks has the effect of omitting or of adding an electrical connection compared with the artwork of the circuit that has to be fabricated.

When the use of an erroneous lithography mask has the effect of omitting an electrical connection, those skilled in the art know how to repair the electronic circuit by restoring the missing electrical connection. To do this, an additional step is carried out during the production of the metallization level that corresponds to the missing electrical connection. This step is carried out after exposure of the masking resist deposited on the circuit using the erroneous lithography mask and before deposition of the metal. When the resist is a positive resist, the step consists of an additional exposure of the resist at the point of the missing connection. It is exposed either to an electron beam or to ultraviolet radiation through an additional mask produced for this purpose. The resist is then sensitized at the point of the missing connection and can be dissolved at this point at the same time as the resist parts that were sensitized during the initial exposure. The metal then deposited on those parts of the circuit that correspond to the dissolved resist parts form electrical connections, that include the electrical connection omitted during the design of the erroneous lithography mask.

There is a need for a way to repair an integrated circuit when a lithography mask used for producing the circuit includes an error of the type that causes the formation of an undesirable electrical connection.

SUMMARY OF THE INVENTION

The invention proposes a method of repairing an integrated electronic circuit, comprising the formation of an electrical isolation between two conducting parts of the circuit that are located at respective places in the circuit. A volume is hollowed out beforehand for the purpose of forming an electrical connection that connects the two places. The method comprises the following steps:

a) formation of a mask on the circuit having an aperture that reveals the hollowed out volume;

b) deposition of an electrically insulating material on that part of the circuit revealed by the mask, so as to at least partly fill the hollowed out volume; and c) removal of the insulating material possibly present on the mask and of the mask, so as to leave the volume at least partly filled with insulating material.

According to the method of the invention, the volume hollowed out beforehand for the purpose of forming a connection is filled, entirely or only partly, with electrically insulating material. This filling operation is carried out so that the electrically insulating material obstructs said hollowed out volume. In other words, the electrically insulating material cuts, within the hollowed out volume, any line connecting one of the respective places of the two conducting parts to the other. In particular, the electrically insulating material may be deposited so as to occupy a section of the hollowed out volume transverse to a direction connecting the two places of the conducting parts.

The invention therefore allows a person skilled in the art to repair an integrated electronic circuit when one or more lithography masks used for producing the electrical connections in the circuit include an error. This is because it is possible henceforth to correct such an error, which consists either of a missing electrical connection or an undesirable additional electrical connection.

One advantage of the invention lies in the economy of the corrected lithography mask(s), since the method of the invention makes it possible to obtain corrected electrical connections of the circuit from the lithography mask(s) containing the error. Put another way, the error is repaired within the circuit itself and not within the lithography mask.

Another advantage of the invention is, after discovery of the error, there is a saving in time to launch the fabrication of the corrected circuit, as compared with having to produce new lithography masks that do not contain the error.

Yet another advantage of the invention is the compatibility of the proposed method with the standard machines for fabricating integrated electronic circuits.

The invention also relates to an integrated electronic circuit comprising two conducting parts that are electrically isolated from each other by a portion of an electrically insulating material, said portion forming an electrical isolation added using the method described above.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

In the figures, for the sake of clarity, the dimensions of the various parts of the circuit that are shown have not been drawn to scale. All the figures are sectional views of a substrate carrying various materials attached to a planar surface of the substrate. The sectional views are considered in a plane perpendicular to the surface of the substrate, and the substrate is placed in the lower part of each figure. In the figures, identical references correspond to identical elements and D denotes a direction perpendicular to the surface of the substrate, directed upwards in the figures. The terms "on", "under", "above", "below" and "upper" are used thereafter with reference to the direction D.

Moreover, the elementary method steps carried out using methods known to those skilled in the art will not be explained in more detail below. Information is given only as regards the combination of these elementary steps according to a defined chronological order of execution that characterizes the invention.

The invention will now be described within the context of preventing the formation of an electrical connection lying approximately perpendicular to the plane of the circuit. Such an electrical connection is known to those skilled in the art as a via and is intended for electrically connecting together two superposed conducting parts in the direction D, which may be metal tracks lying within respective metallization levels parallel to the surface of the substrate.

Figure 1A:
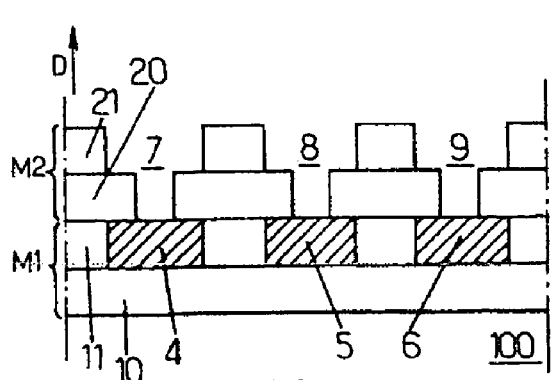
FIGS. 1a to 1f illustrate the implementation of the invention for eliminating an electrical connection, such as a via.

In FIG. 1a, a substrate 100 is covered with two metallization levels M1 and M2. The level M1 includes two layers of electrically insulating material 10 and 11, superposed in the direction D, and the level M2 includes two layers of electrically insulating material 20 and 21. The layers 10, 11 and 20, 21 are, for example, made of silica $SiO_2$. The metallization levels M1 and M2 may, for example, be produced using the "dual damascene" method known to those skilled in the art. Hard mask layers, possibly made of silicon nitride $Si_3N_4$, are then placed between the layers 10 and 11, between the layers 11 and 20 and between the layers 20 and 21. The layer 11 includes metal inserts 4, 5 and 6, for example made of copper or aluminum, which may constitute electrical signal transporting tracks running parallel to the surface of the substrate 100. Depending on the design of the integrated electronic circuit, the tracks 4 and 6 have to be electrically connected to respective metal inserts placed in the layer 21 (referenced 14 and 16 in FIG. 1f, respectively), above the tracks 4 and 6, respectively. For this purpose, volumes 7 and 9 have been etched in the layers 20 and 21, using the "dual damescene" method, above the tracks 4 and 6 for the purpose of forming respective electrical connections.

Given that the final circuit also includes, in the layer 21, an upper track (reference 15 in FIG. 1f) located above the track 5, a volume 8 has also been hollowed out in the layer 21, above the track 5, in the manner shown in FIG. 1a. Because a lithography mask containing an error was used, the hollowed out volume 8 includes an extension into the layer (20) as far as the track 5, for the purpose of forming an electrical connection. Continuing to produce the metallization level M2 would normally end up in fact with the formation of a via between the tracks 5 and 15, located in the extension of the volume 8 into the layer 20. However, implementation of the repair method now described will prevent the tracks 5 and 15 from being electrically connected in the final circuit.

Figure 1B:
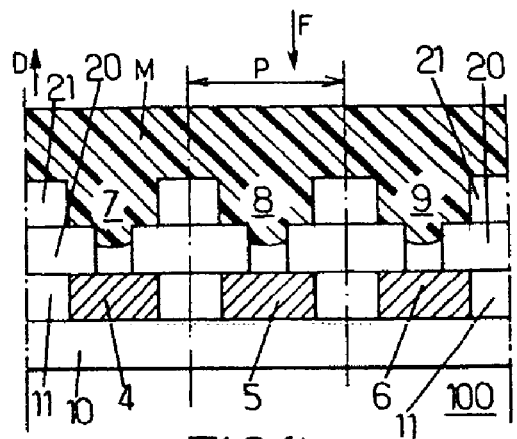

According to the method, a resist mask M is deposited on the circuit, as shown in FIG. 1b. Optionally, the resist of the mask M may partly penetrate the volumes 7 9. An aperture is made in the mask M by removing a part P from the mask M that covers the volume 8. To do this, an electron beam F is, for example, directed onto the upper surface of the mask M, in the part P of the mask M. The energy of the electrons of the beam is, for example, greater than 20 keV (kiloelectron volts) so as to sensitize the resist over its entire thickness along the direction D, including within the volume 8. In a known way, depending on the type of resist used, a first annealing operation of the resist, called a "soft bake" using the jargon of those skilled in the art, may be carried out before sensitization of the resist, and a second annealing operation, called a "hard bake" may be carried out after sensitization.

Figure 1C:
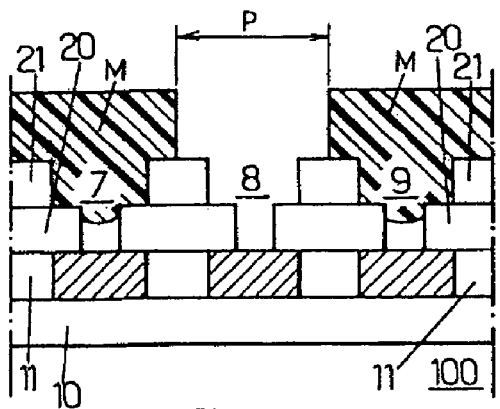

The resist is then developed in a suitable dissolving liquid, so that a resist part P as sensitized by means of the electron beam F is dissolved. To do this, a positive resist is preferably used. The configuration of the circuit illustrated in FIG. 1c is then obtained.

Figure 1D:
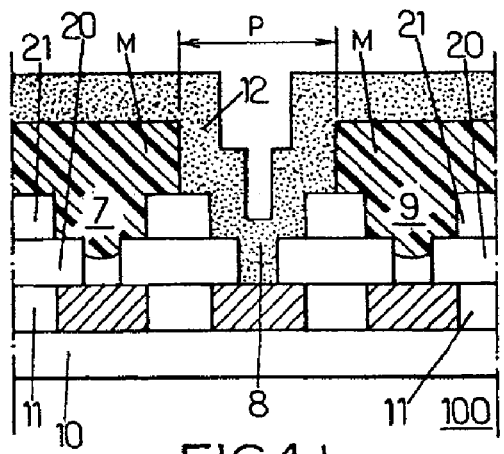

Next, a layer 12 of an electrically insulating material is deposited on the circuit, in particular within the aperture P of the mask M (FIG. 1d). Outside the aperture, the layer 12 covers the mask M. In the aperture, the material of the layer 12 is deposited on the layer 21 and in the volume 8.

The electrically insulating material of the layer 12 may be deposited by sputtering. In this deposition technique, the circuit is placed so as to face a target of a specified material. A plasma is created between the target and the circuit, and the circuit is taken to a negative potential with respect to the circuit. Positive ions contained in the plasma then sputter the target and atoms drawn off the surface of the target are deposited on the circuit to form the layer 12.

The electrically insulating material of the layer 12 comprises, for example, silicon atoms. The target used may then be made of silicon, or an alloy containing silicon. Gas molecules of oxygen, nitrogen and/or a compound containing carbon atoms, such as methane $CH_4$, may be introduced into the sputtering plasma so as to form a layer 12 of silica $SiO_2$, silicon nitride $SiN_x$ or silicon carbide SiC, respectively. A mixture of these gases introduced into the sputtering plasma results in the formation of a mixture material for the layer 12.

Figure 1E:
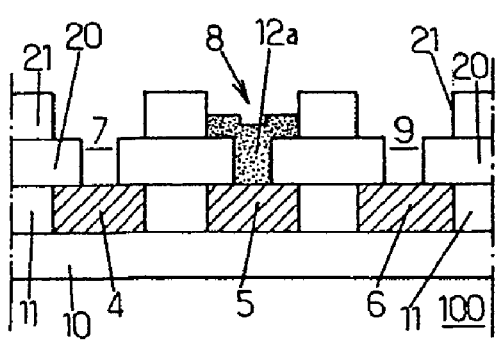

The mask M is then entirely removed, for example by dissolving it. That part of the layer 12 present above the mask M may optionally be removed before the mask M by a suitable method such as, for example, dry etching. Preferably, the material of the layer 12 present on the mask M is removed at the same time as the mask M during dissolution of the mask in a suitable liquid solution. This is because the liquid for dissolving the mask M can penetrate via cracks in the layer 12 down to the mask M, which is generally sufficient to start to dissolve the mask M and separate that part of the layer 12 present on the mask M from the circuit. Optionally, a residual part of the layer 12 above the upper surface of the layer 21 may be removed by a planarizing polishing operation. After such a polishing operation, insulating material of the layer 12 remains only inside the volume 8, without filling the volume 8 up to the level of the upper surface of the layer 21. The volume 8 is then partly filled with insulating material, up to a certain (non zero) height measured from the upper face of the track 5 (FIG. 1e). The insulating material 12a remaining in the volume 8 lies essentially in the extension of the volume 8 in the layer 21. The volumes 7 and 9 are once again hollowed out.

Figure 1F:
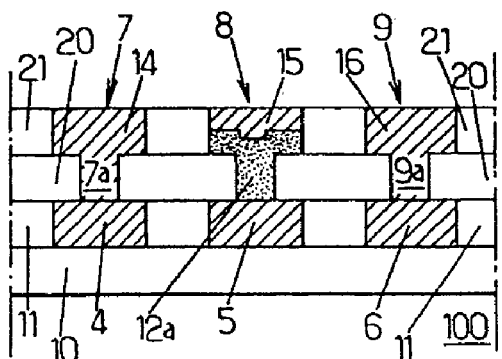

The method for forming the electrical connections is then continued in the usual manner. A metal is deposited on the circuit so as to fill the volumes 7 and 9. The upper part of the volume 8 is filled at the same time. Finally, excess metal lying above the level of the upper surface of the layer 21 is removed, for example by CMP (Chemical Mechanical Polishing). The configuration of the electronic circuit shown in FIG. 1f is then obtained. A via 7a, located in the volume 7, electrically connects the track 4 to the track 14 based within the layer 21, and a via 9a located in the volume 9 electrically connects the track 6 to the track 16. The track 15 is formed at the same time within the layer 21, above the track 5, while remaining, however, electrically isolated from the latter by the volume 12a of electrically insulating material.

FIGS. 2a to 2f illustrate the method of the invention within the context of preventing the formation of an electrical connection placed approximately parallel to the plane of the circuit.

Figure 2A:
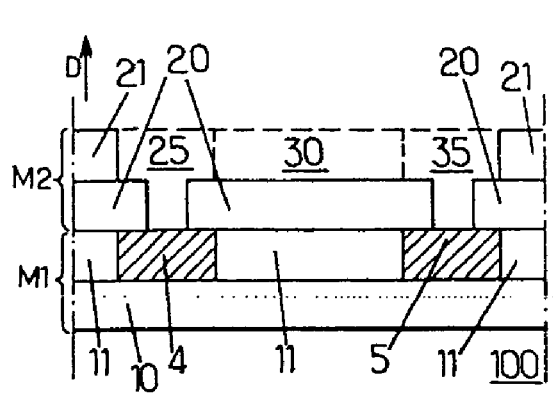
FIGS. 2a to 2f illustrate the implementation for eliminating an electrical connection, such as a track.
Figure 2B:
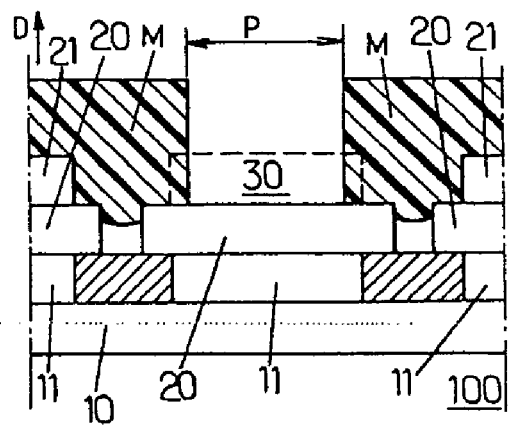

FIG. 2a shows a circuit being produced on a plane substrate 100, again using the "dual damascene" method. Tracks 4 and 5 have been placed in the layer of electrically insulating material 11 of the metallization level M1. The reference 10 again denotes the lower layer of the metallization level M1. During formation of the metallization level M2, volumes 25 and 35 have been etched in the layers 20 and 21 of insulating material. These volumes 25 and 35 define vias placed in the layer 20, above the tracks 4 and 5 respectively.

Because of the use of a lithography mask containing an error, the layer 21 has also been etched in a volume 30 that connects the volumes 25 and 35, in such a way that, after the subsequent metal deposition corresponding to the metallization level M2, an electrical connection occupying the volume 30 would undesirably connect two metal tracks located in the volumes 25 and 35, respectively. The use of the repair method as described above makes it possible to obtain the metal tracks corresponding to the volumes 25 and 35, without these tracks being connected together within the volume 30.

In the same way as described above with reference to FIGS. 1b and 1c, a resist mask M is deposited on the circuit. The mask M includes an aperture P that reveals the volume 30, said aperture lying in a plane perpendicular to the plane of FIG. 2b and containing the direction D.

Figure 2C:
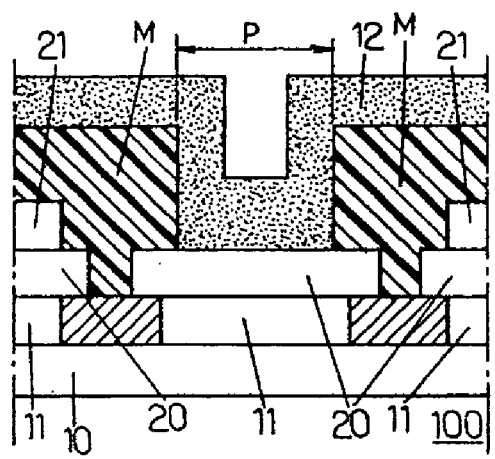
Figure 2D:
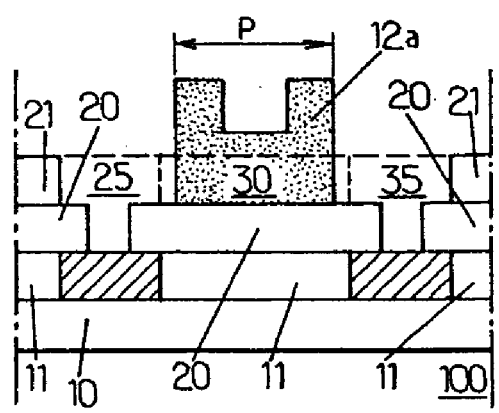

A layer 12 of electrically insulating material is deposited on the circuit, in particular within the aperture P of the mask M (FIG. 2c). After the complete removal of the mask M, a portion 12a of the material of the layer 12 remains above the layer 20, separating the volume 30 into two residual volumes located against the volumes 25 and 35 respectively (FIG. 2d). The portion 12a occupies an entire section of the volume 30, perpendicular to the direction D that connects the two volumes 25 and 35 together.

Figure 2E:
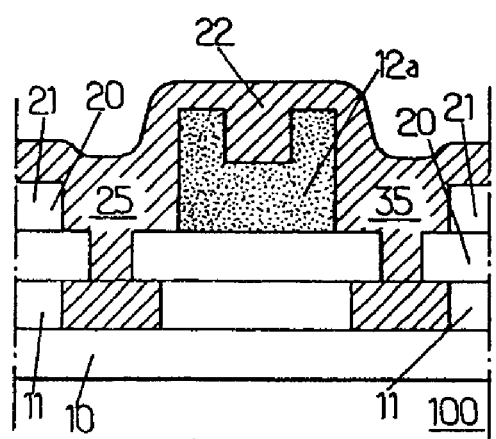
Figure 2F:
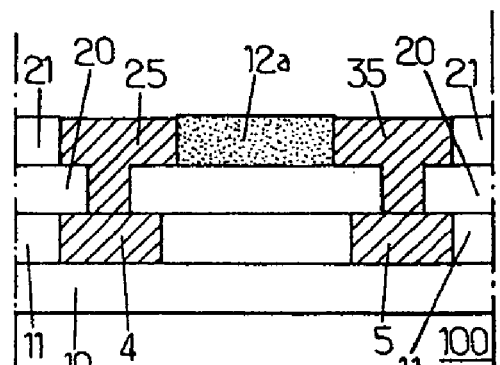

The operation of metallizing the level M2 is then resumed in the usual manner. A metal 22 is deposited on the circuit so as to fill the volumes 25 and 35 (FIG. 2e). After CMP polishing, two conducting tracks are formed by the metal 22 in the volumes 25 and 35. However, these tracks are isolated from each other by the volume 12a of electrically insulating material leveled off so as to be approximately at the level of the upper surface of the layer 21 (FIG. 2f).

The method of the invention has been described in detail above within the context of particular configurations of the electrical connections of an integrated electronic circuit. It will be understood that the application of the method is not limited to these particular configurations. The method may also be used within the context of electrical connections produced by a method other than the "dual damascene" method. Likewise, the mask sensitized by an electron beam may be replaced, in particular, with a resist mask sensitive to ultraviolet radiation, by adapting the corresponding steps of the method.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method of repairing an integrated electronic circuit, comprising the formation of an electrical isolation between two conducting parts of the circuit that are located at respective places of the circuit, a volume having been errantly hollowed out for the purpose of forming both at least one of the conducting parts and an electrical connection that connects the two places, the method comprising the following steps:
   a) formation of a mask on the circuit having an aperture that reveals a portion of the errantly hollowed out volume;
   b) deposition of an electrically insulating material on that portion revealed by the mask, so as to at least partly fill the errantly hollowed out volume; and
   c) removal of the mask, so as to leave the errantly hollowed out volume at least partly filled with insulating material; and
   d) depositing an electrically conducting material in a non-filled portion of the errantly hollowed out volume so as to form at least one of the two conducting parts electrically insulated from the other of the conducting parts by the deposited insulating material.

2. The method according to claim 1, wherein the aperture in the mask is defined by directing an electron beam onto a part of the mask corresponding to said aperture.

3. The method according to claim 1, wherein the insulating material present on the mask is removed at the same time as the mask during an operation of dissolving the mask in a liquid solution.

4. The method according to claim 1, wherein the integrated electronic circuit is substantially planar and the electrical connection lies approximately perpendicular to the plane of the circuit.

5. The method according to claim 1, wherein the integrated electronic circuit is substantially planar and the electrical connection is substantially parallel to the plane of the circuit.

6. The method according to claim 1, wherein the electrically insulating material is deposited by sputtering.

7. The method according to claim 1, wherein the electrically insulating material contains silicon atoms.

8. A method for integrated circuit repair during circuit fabrication, comprising:
   using a fabrication mask which includes an error that produces both a volume for a conducting part of the circuit and an incorrect volume between two conducting parts of the circuit;
   forming a mask having an aperture that reveals the incorrect volume;
   forming an electrically insulating material block using the mask to at least partly fill the incorrect volume; and
   depositing a metallization within the volume for the conducting part to form at least one of the two conducting parts, the formed electrically insulating material block insulating the two conducting parts from each other to correct for the error in the fabrication mask.

9. The method according to claim 8, wherein the aperture in the mask is defined by directing an electron beam onto a part of the mask corresponding to said aperture.

10. The method according to claim 8, wherein the incorrect volume extends vertically between two metallizations which form the two conducting parts.

11. The method according to claim 8, wherein the incorrect volume extends horizontally along a single metallization which forms the two conducting parts.

12. A method for repairing an incorrectly lithography defined via location in an integrated circuit during fabrication, comprising:
   forming a mask including an aperture exposing the via location above a first metallization and exposing a second metallization region above the via location;

depositing an insulator through the mask aperture to at least partly fill the via location with the insulator but not fill the second metallization region; and forming a second metallization above the insulator in the second metallization region, the insulator correcting for the incorrectly defined via location and preventing electrical connection between the first and second metallizations.

13. A method for repairing an incorrectly lithography defined metallization location including two metallization segments in a metallization layer of an integrated circuit during fabrication, comprising:

forming a mask including an aperture exposing a portion of the incorrectly lithography defined metallization location;

filling the portion with an insulator deposited through the aperture in the mask; and forming the metallization segments in the metallization layer with the insulator in the portion correcting for the incorrectly defined metallization location and preventing electrical connection between the two metallization segments.

* * * * *